United States Patent
Romo

(10) Patent No.: US 10,551,261 B2
(45) Date of Patent: Feb. 4, 2020

(54) JOINT FOR BRITTLE MATERIALS

(71) Applicant: Rosemount Inc., Shakopee, MN (US)

(72) Inventor: Mark G Romo, Eden Prairie, MN (US)

(73) Assignee: Rosemount Inc., Shakopee, MN (US)

(*) Notice: Subject to any disclaimer, the term of this patent is extended or adjusted under 35 U.S.C. 154(b) by 288 days.

(21) Appl. No.: 15/445,279

(22) Filed: Feb. 28, 2017

(65) Prior Publication Data
US 2018/0245997 A1    Aug. 30, 2018

(51) Int. Cl.
*G01L 9/00* (2006.01)
*G01L 19/14* (2006.01)
*G01L 19/04* (2006.01)

(52) U.S. Cl.
CPC .......... *G01L 9/0041* (2013.01); *G01L 19/147* (2013.01); *G01L 19/04* (2013.01); *H01L 2224/16225* (2013.01); *H01L 2224/32225* (2013.01)

(58) Field of Classification Search
CPC ..... G01L 9/0041; G01L 19/147; G01L 19/04; H01L 2224/32225; H01L 2224/16225; B23K 35/0222; B23K 1/0016
See application file for complete search history.

(56) References Cited

U.S. PATENT DOCUMENTS

| 4,168,630 | A | * | 9/1979 | Shirouzu | G01L 19/147 257/419 |
| 5,128,746 | A | * | 7/1992 | Pennisi | B23K 35/3613 257/673 |
| 5,635,649 | A | * | 6/1997 | Tobita | G01L 19/0084 73/708 |
| 5,852,320 | A | * | 12/1998 | Ichihashi | G01L 19/0038 257/419 |
| 5,945,605 | A | * | 8/1999 | Julian | G01L 19/0627 257/419 |
| 6,062,088 | A | * | 5/2000 | Ingrisch | G01L 9/006 73/727 |
| 6,881,499 | B2 | | 4/2005 | Shinkai et al. | |
| 6,938,490 | B2 | | 9/2005 | Wagner et al. | |
| 7,661,318 | B2 | | 2/2010 | Brosh et al. | |
| 7,861,595 | B2 | | 1/2011 | Brown et al. | |
| 8,065,917 | B1 | | 11/2011 | Brown et al. | |
| 8,230,743 | B2 | * | 7/2012 | Wade | G01L 9/0052 73/706 |
| 8,516,897 | B1 | * | 8/2013 | Jones | G01L 19/147 257/414 |
| 8,591,756 | B2 | | 11/2013 | Wei et al. | |
| 8,707,794 | B2 | * | 4/2014 | Usui | G01L 19/147 73/700 |

(Continued)

OTHER PUBLICATIONS

International Search Report and Written Opinion, dated Jun. 4, 2018, for International Patent Application No. PCT/US2018/018321, 16 pages.

*Primary Examiner* — Jonathan M Dunlap
(74) *Attorney, Agent, or Firm* — Christopher R. Christenson; Kelly, Holt & Christenson PLLC

(57) ABSTRACT

A method of joining a brittle material to a component is provided. The method includes depositing a metallization layer on a surface of the brittle material. A layer of joining material is applied between the brittle material and the component, such that the component and the brittle material define an interface area. The metallization layer and the joining material layer extends beyond the interface area.

20 Claims, 8 Drawing Sheets

(56) References Cited

U.S. PATENT DOCUMENTS

| | | |
|---|---|---|
| 8,734,657 B2 | 5/2014 | Au et al. |
| 9,116,057 B2 | 8/2015 | Brown et al. |
| 2002/0027294 A1* | 3/2002 | Neuhaus .......... G06K 19/07752 257/778 |
| 2003/0218261 A1* | 11/2003 | Capote ................ B23K 35/025 257/787 |
| 2005/0120798 A1 | 6/2005 | James |
| 2009/0282925 A1* | 11/2009 | Machir ................ G01L 19/148 73/756 |
| 2011/0067751 A1 | 3/2011 | Meakin et al. |
| 2015/0160086 A1 | 6/2015 | Ponath et al. |
| 2018/0127269 A1* | 5/2018 | Long .................... B23K 1/0016 |
| 2019/0092629 A1* | 3/2019 | Long .................... B23K 1/0016 |
| 2019/0092630 A1* | 3/2019 | Long .................... B23K 1/0016 |

\* cited by examiner

JOINT FOR BRITTLE MATERIALS

BACKGROUND

Many devices and applications require a component, such as a sensor or other electronic device, to be mounted or affixed to a brittle material, such as a ceramic, glass, or crystalline material. Typically, a metal layer is deposited on the brittle material using a suitable process, such as vapor deposition, and the component is then soldered or brazed to the metallization layer. Differences in coefficients of thermal expansion can give rise to stresses that can damage the joint or otherwise shorten its lifetime. Providing an improved joint between a component and a brittle material would provide an important advance to many industries.

SUMMARY

A method of joining a brittle material to a component is provided. The method includes depositing a metallization layer on a surface of the brittle material. A layer of joining material is applied between the brittle material and the component, such that the component and the brittle material define an interface area. The metallization layer and the joining material layer extends beyond the interface area.

DETAILED DESCRIPTION OF ILLUSTRATIVE EMBODIMENTS

There are many applications where solder or braze is used to join one component, which can be malleable or brittle itself, to a brittle material. The brittle material can be an electrical insulator such as glass, ceramic, or a crystalline material. Brittle materials require metal to be deposited on a specific defined area first in order to enable a later-applied solder or braze joint. It is desired for the solder and braze to coat the entire metallized area. Solder and braze have a very different thermal expansion coefficient compared to brittle materials such as ceramic. The differing thermal expansion coefficient of the solder or braze, relative to the base brittle material, results in stress during the cooling process after the initial joining. The edge of the metalizing, where solder or braze flows or wets to the very edge of the deposited metal, can also concentrate stress, causing a stress riser to develop.

While embodiments of the present invention will be described with respect to a particular physical embodiment that uses an improved joint to couple a pressure sensor within a pressure transmitter, those skilled in the art will recognize that embodiments of the present invention can be practiced wherever different coefficients of thermal expansion between materials joining a brittle material to a component create challenges.

Stress concentration issues intensify when the edge of the metal is close to, or within the boundaries of the two joined parts. This is particularly true for small part applications like micro-electrical mechanical systems (MEMS), which are present in pressure sensors, for example. Thermal expansion differences between a metal layer and a ceramic layer at an interface can also add to the stress levels throughout the interface area. If stress at the stress riser location is above the strength limit of the ceramic layer, a crack can start to form. The crack in a stressed volume will grow until stress at the crack front is below the strength of the material. The result can be a failed joint between the ceramic layer and the metal layer.

Figure 1A:
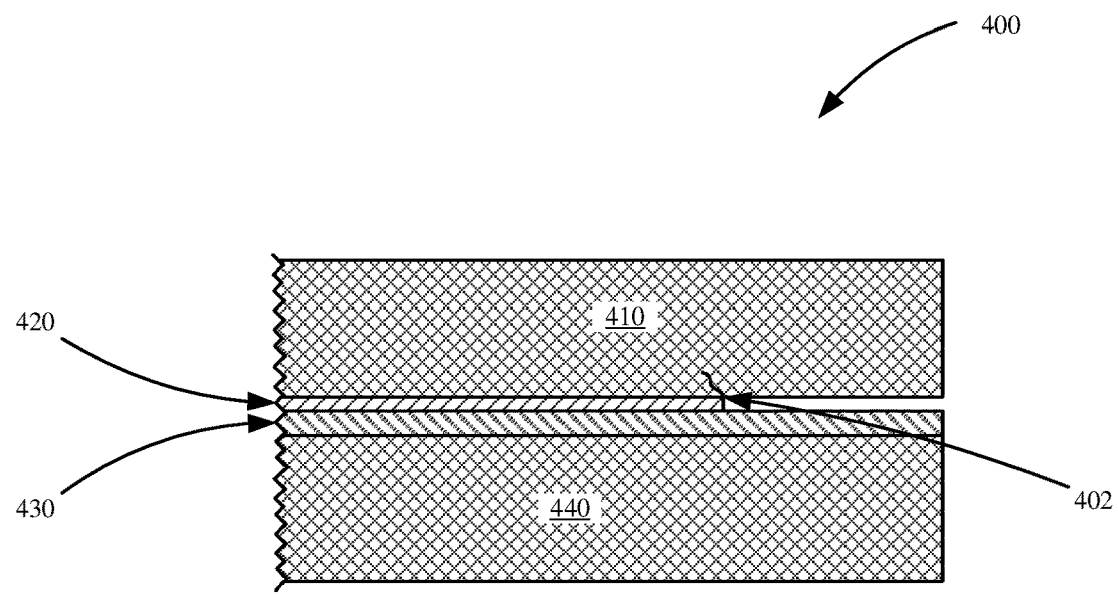
FIGS. 1A and 1B are cross-sectional views illustrating some example coupling scenarios between a brittle material and a component that can generate stress issues.
Figure 1B:
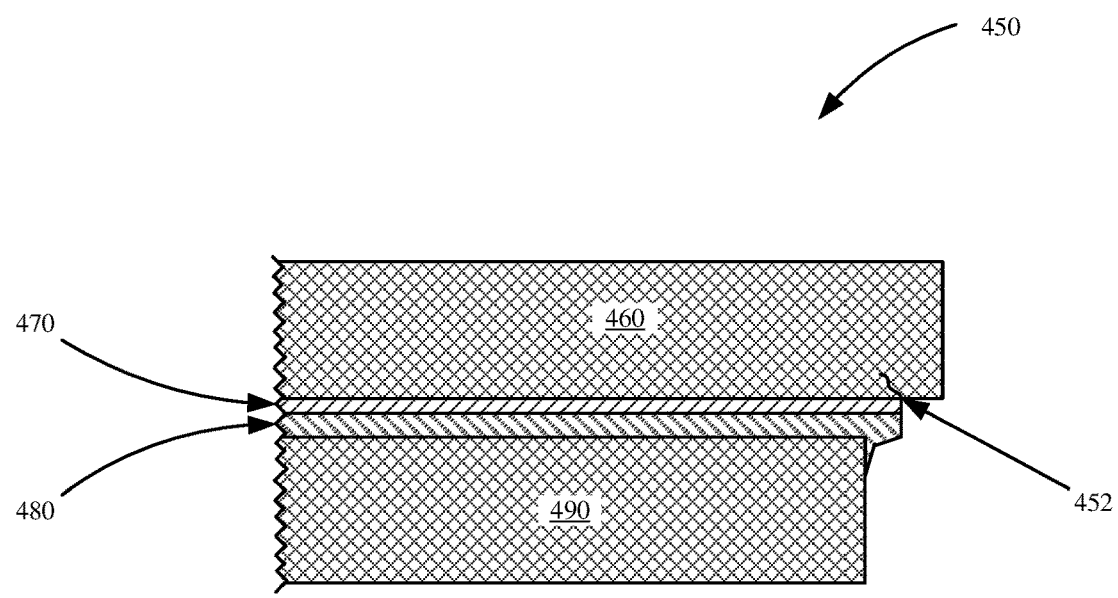

FIGS. 1A and 1B illustrate some example coupling scenarios between a metal and brittle component which can generate stress risers. FIG. 1A illustrates one example of a less capable coupling between a brittle material layer 410 and a metal layer 440 using metalization 420 and solder or braze 430. Brittle material 410, for example, could be the ceramic layer of a pressure sensor pedestal such as that described below. Metal layer 440 could be, for example, a pressure sensor or portion thereof.

As shown in FIG. 1A, a crack is initiated at a crack point 402 where a stress riser location is above the strength limit of brittle material 410. In the example shown in FIG. 1A, metallized area 420 of the brittle material 410 ends between the mating surfaces of the joint, which is where crack 402 begins. Typically, in MEMS applications, metal layers must be patterned for the required electrical isolation. If the materials involved had similar matching thermal expansions, the joint could be more capable. The case of matching expansion coefficients, however, rarely occurs.

FIG. 1B illustrates one potential solution for avoiding the cracking situation illustrated in FIG. 1A. FIG. 1B illustrates a metallized portion 470, is slightly larger than a metal component 490. The result is a stress riser at metallized termination point 452. Adding a solder or braze layer 480 can, however, increase experienced stress, as the thicker solder or braze layer increases stress at metallized termination point 452.

In accordance with embodiments of the present invention, termination point 452 of the metallization is relocated on the brittle material away from the already-stressed locations. Termination point 452, then, cannot be located in the interface area between component 490 and brittle material 460 if cracking is to be avoided. The area near the boundary of the joint between component 490 and brittle material 460 is also a poor location for termination point 452 as it can also have high stress. In one embodiment, terminating solder/braze wetting material is practical to enable self-alignment of brittle material 460 and component 490. One part is positioned on the other by the surface tension of the solder. This then has the stress riser metal termination close to the joint and within the high stress status of the joint.

Figure 2:
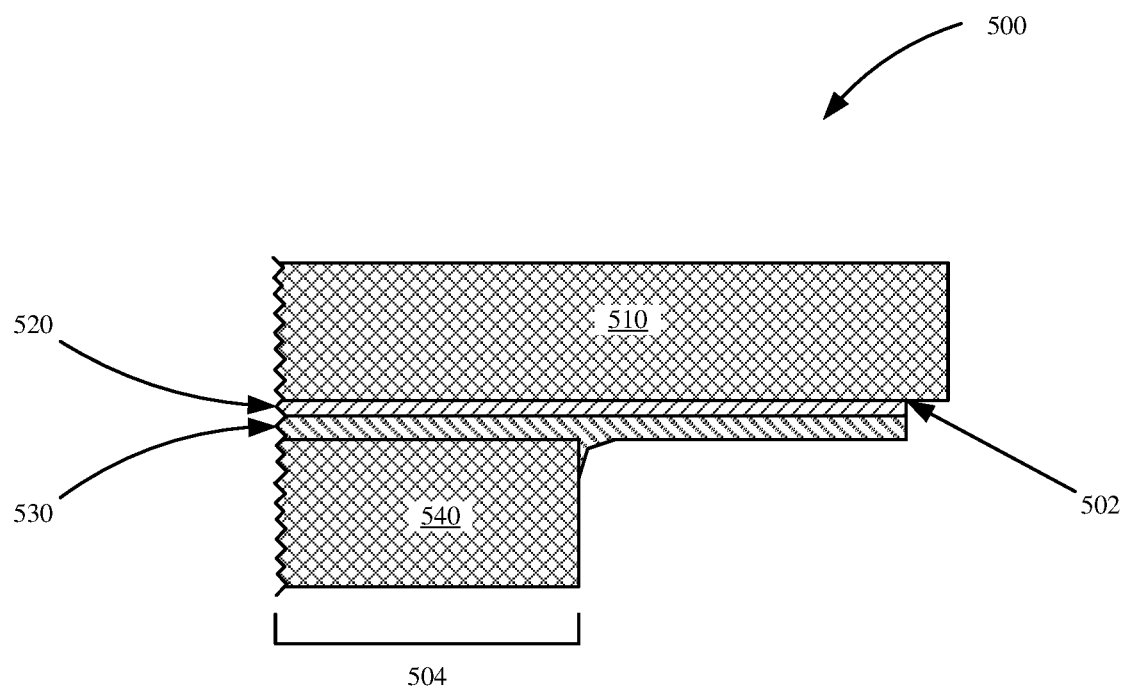
FIG. 2 is a cross-sectional view illustrating with a stress riser separated from an interface area in accordance with an embodiment of the present invention.

FIG. 2 is a cross-sectional view of a coupling in accordance with one embodiment of the present invention. Joint 500 occurs between a brittle material 510 and a metal component 540. Brittle material 510 is subjected to a deposition process in which metal layer 520 is provided, in one embodiment. Deposited metal layer 520, in one embodiment, enables a solder or braze layer 530 to wet to brittle material 510 in advance of a joining to metal component 540. In one embodiment, both deposited metal layer 520 and solder or braze layer 530 extend beyond joint interface area 504 of metal component 540. In one embodiment, termination point 502 is located away from join area 504, such that the stress riser at metallized termination 502 is outside of the high stress area between brittle material 510 and component 540. In one embodiment, solder or braze layer 530 has a different coefficient of thermal expansion than that of brittle material 510. The thickness of solder or braze 530 located away from the joint is, in one embodiment, thinner than if it were adjacent joint 500, resulting in lower stress at the metal termination point 502 because of the thinner solder layer 530. Because solder 530 and brittle materials 510 often have different coefficients of thermal expansion, thinner solder 530 is better to reduce stress at metal termination point 502 to avoid damaging brittle material 510 such that a risk of damage joint 500 is reduced.

Figure 3:
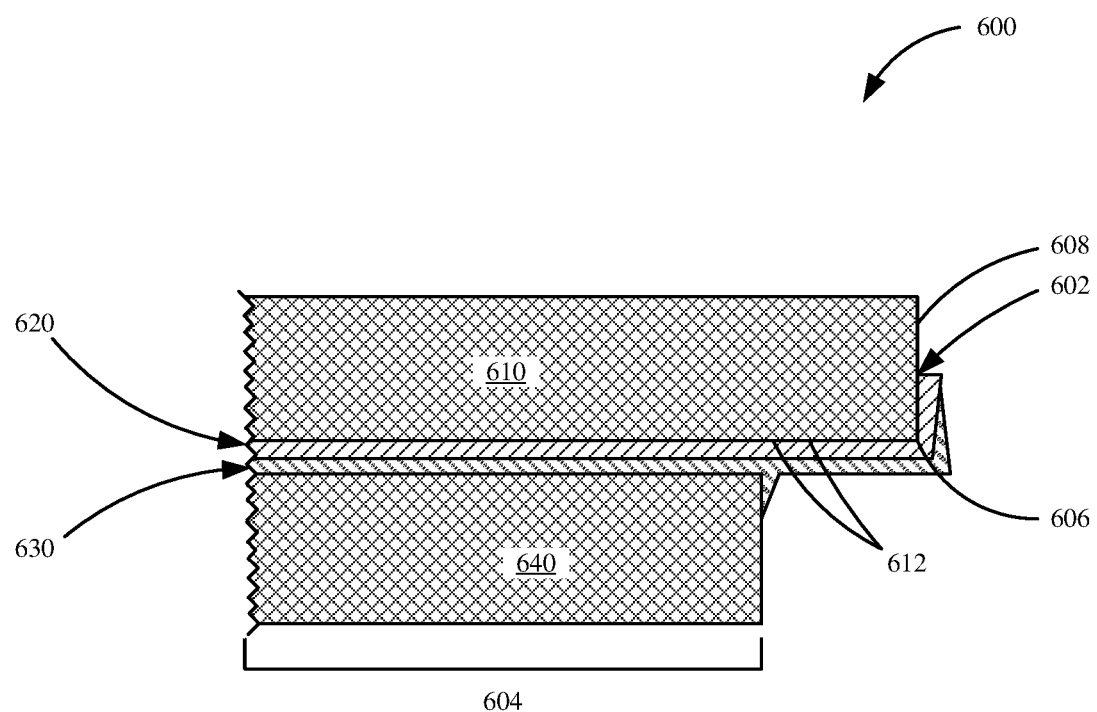
FIG. 3 is a cross-sectional view illustrating a coupling scenario with a stress riser located on a separate face from an interface area in accordance with an embodiment of the present invention.

FIG. 3 illustrates a coupling scenario with a stress riser located on a separate face from the interface area in accordance with one embodiment of the present invention. Joint 600 includes a termination point 602 on a surface 608, which is an adjacent surface to joint surface 612 and separated by an edge 606. Joint 600 includes a brittle material 610 coupled to a metal component 640, for example a ceramic layer 610 coupled to a metal layer 640. The brittle material 610, in one embodiment, is first coated with a deposited metal layer 620 that, as shown in FIG. 3, extends along a length of a surface of brittle layer 610. In one embodiment, as shown in FIG. 3, deposited metal layer 620 extends along surface 612, past edge 606, and up a portion of surface 608. Positioning metallization termination point 602 on a surface other than joining surface 612 causes the stress riser to have significant separation from the solder joint. Separating the solder joint across multiple surfaces of brittle material 610 can effectively reduce a surface stress in a shorter distance than a similar amount of deposited metal layer 620 just placed on surface 612 of the joint. The orientation of the stress riser in joint 600 is out of the plane of surface 612.

FIG. 3 illustrates one embodiment comprising a convex edge feature 606 over which the metallization forms. The convex edge feature 606 provides a deterrent to applied solder 630 wetting beyond termination point 602, as shown in FIG. 3. Reducing an amount of deposited solder at metal termination point 602 also reduces the stress level at the stress riser. If, instead of a convex feature, a concave feature were present, the solder transfer might be increased, putting joint 600 at risk of damage.

Figure 4:
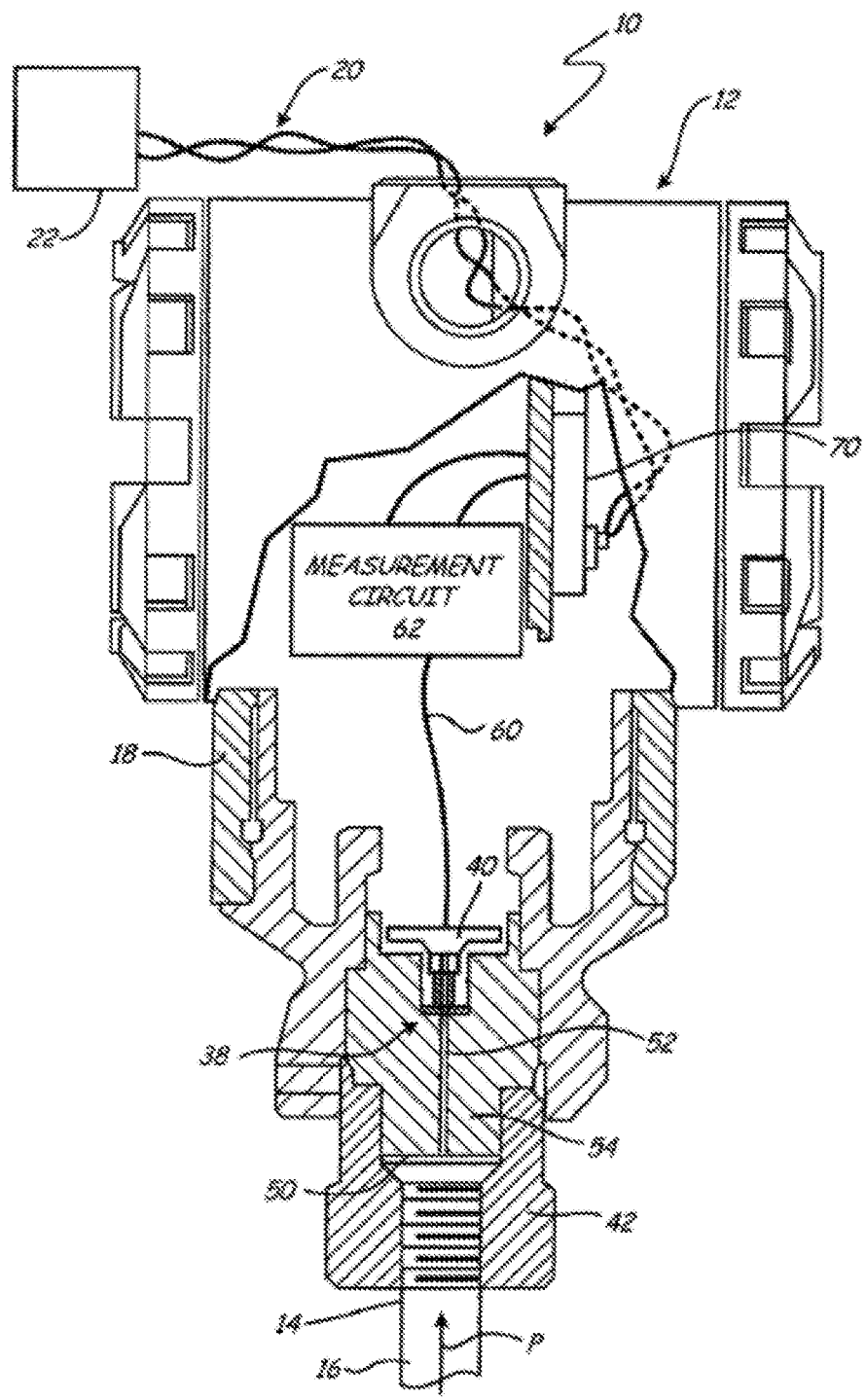
FIG. 4 is a partial cutaway view of a pressure transmitter having a pressure sensor mount in accordance with an embodiment of the present invention.

FIG. 4 is a partial cutaway view of a pressure transmitter containing a pressure sensor that is coupled in accordance with an embodiment of the present invention. Process control or measurement system 10 includes a pressure transmitter 12, coupled to process piping 14 carrying a process fluid 16. In one embodiment, transmitter 12 is a measurement component of system 10 configured to measure a pressure, P, applied by process fluid 16 to pressure transmitter 12. Pressure transmitter 12 provides an output, in one embodiment, over a two wire process control loop 20, to a remote location, for example a control room 22. Process control loop 20 can operate in accordance with any appropriate protocol. In one embodiment, process control loop 20 is a two wire process control loop with an analog current level representing a "process variable" related to the process pressure, P. In another example, process control loop 20 carries a digital value which is related to the process pressure, P. Some examples of protocols include the HART® or the FOUNDATION™ Fieldbus communication protocol, a wireless communication link or any other suitable protocol. In one embodiment, element 20 represents a wireless communication link between transmitter 12 and process control room 22.

Transmitter 12 includes a pressure sensor 40. In one embodiment, pressure sensor 40 is a pressure sensor die, which includes an element that deflects in response to an applied pressure. The element includes, or is coupled to, a component that has an electrical property that changes in response to applied pressure. A process coupling 42 couples a body or housing 18 of transmitter 12 to process piping 14. This allows the process fluid pressure, P, to be applied to an isolation diaphragm 50 of transmitter 12. The pressure, P, causes a deflection in diaphragm 50 which is transmitted through a passageway 52, which carries an isolation fluid to pressure sensor 40. Passageway 52 extends through a pressure sensor module 54 which also supports pressure sensor 40. Sensor module 54 includes, in one embodiment, a sensor mount 38 that is configured to mount pressure sensor 40. Pressure sensor 40 provides an electrical output 60 to measurement circuitry 62, which, in one embodiment, connects to a terminal block 70, which couples to process control loop 20. In one example configuration, process control loop 20 is also used to provide power to circuitry, such as measurement circuitry 62 of transmitter 12 in one embodiment.

Figure 5:
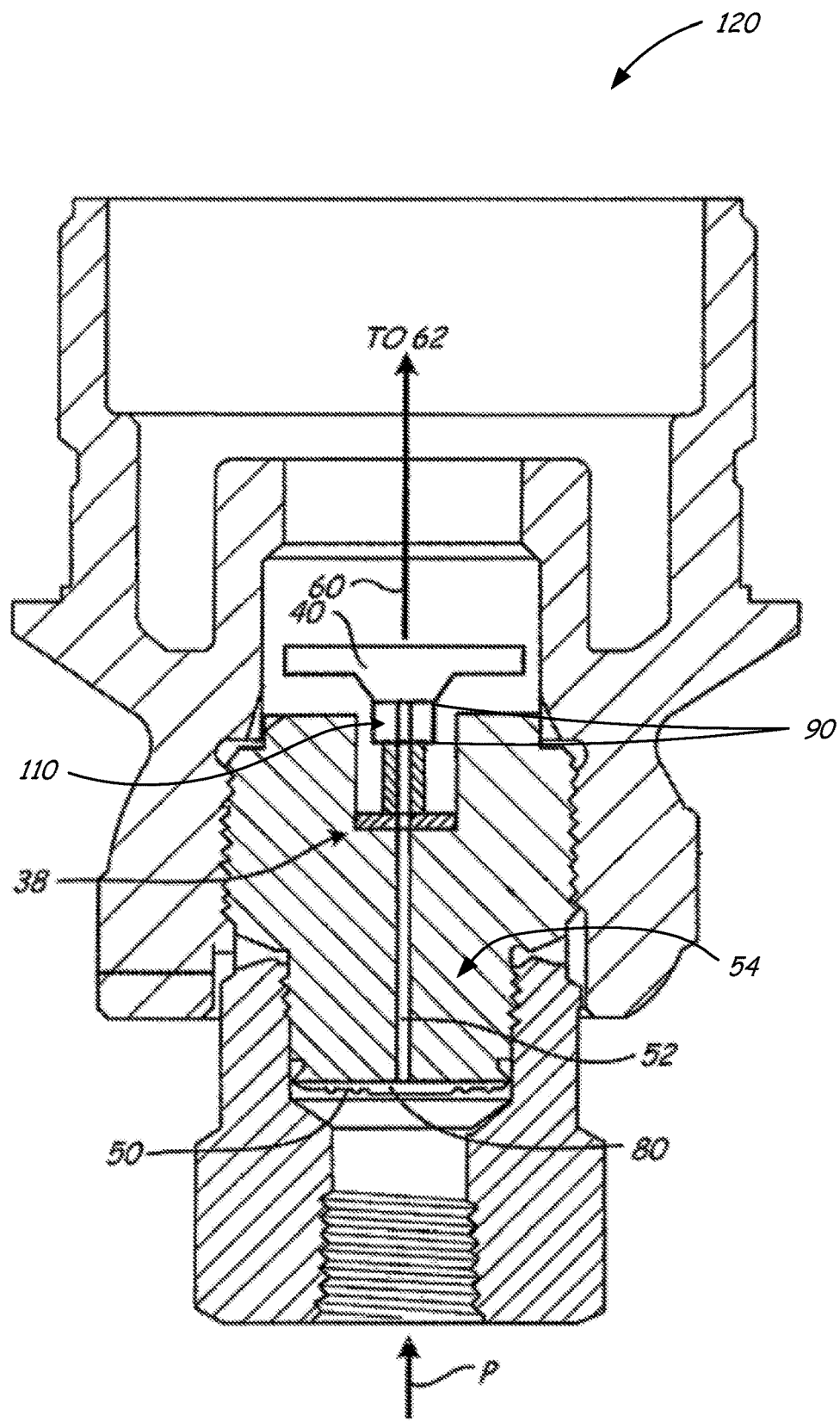
FIG. 5 is an enlarged cross-sectional view of the pressure transmitter of FIG. 1 showing a pressure sensor mount in accordance with an embodiment of the present invention.

FIG. 5 is an enlarged cross-sectional view of the pressure transmitter of FIG. 4 showing a pressure sensor mount in accordance with one embodiment of the present invention. FIG. 5 illustrates an enlarged view 120 of a portion of transmitter 12, showing sensor mount 38 in greater detail. Note that in FIGS. 4 and 5, sensor mount 38 and pressure sensor 40 are not shown to scale, and are enlarged for illustration purposes.

Examples of processes and components that have been used to mount pressure sensor dies, such as pressure sensor die 40, include metal plating, metal to ceramic joints, adhesives, and other configurations. However, many of these techniques have, in the past, experienced significant reliability issues. For example, metal plating is often used to allow components to be soldered together. However, poor quality plating may result in poor wetting or adhesion of the plating to the component. This results in failures during the manufacturing process as well as reduced reliability in the finished product.

Pressure sensor die 40, in one embodiment, is mounted on a pedestal 110. In one embodiment, pedestal 110 is configured to provide isolation from both mounting and temperature-induced stressed between the housing and the pressure sensor components. In one embodiment, pedestal 110 is cylindrical in shape, with a bore extending throughout, such that capillary tube 52 can be received. However, because of its construction, pedestal 110 is susceptible to potential cracking, for example at either of interfaces 90 illustrated in FIG. 5.

Figure 6A:
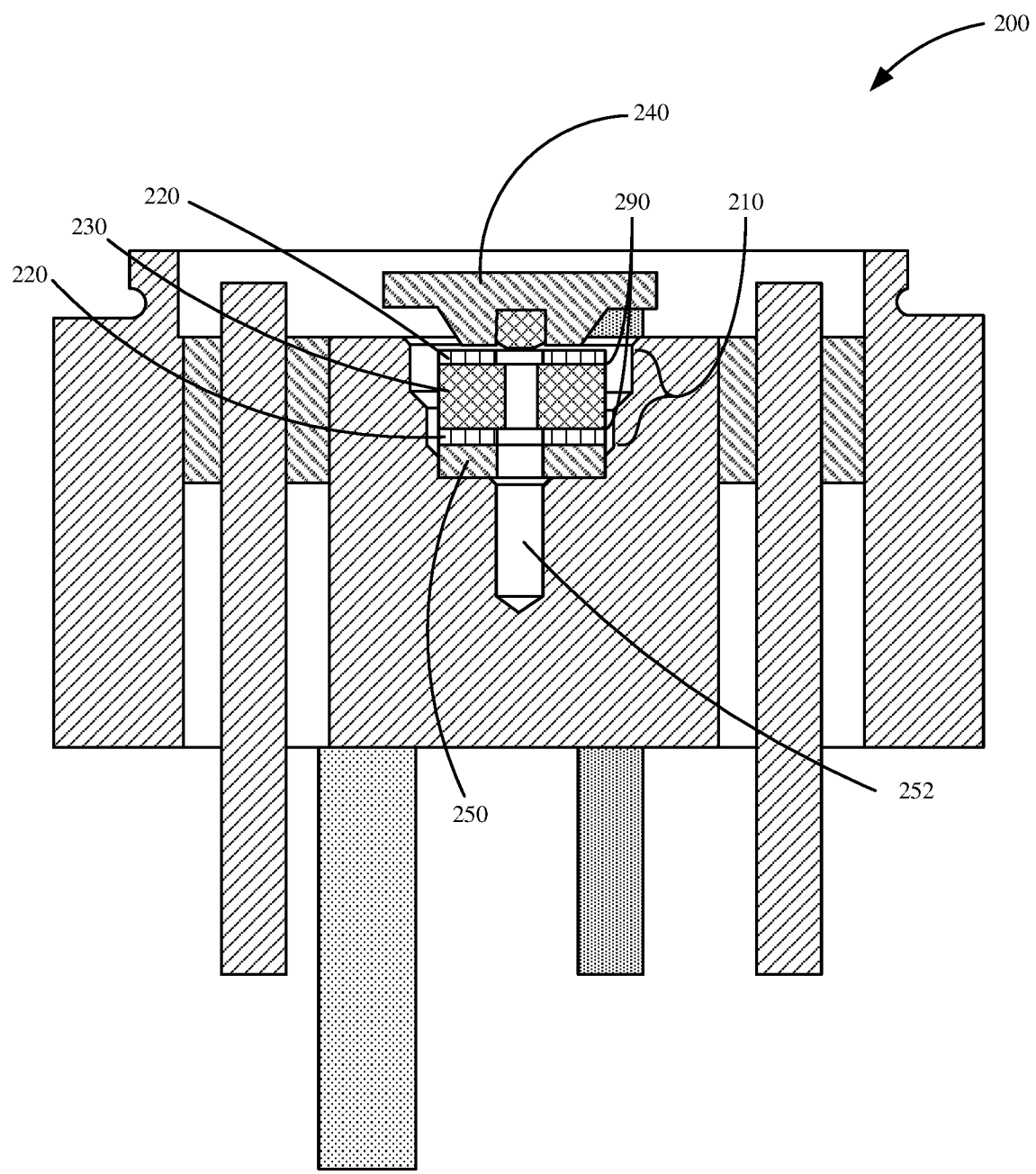
FIGS. 6A and 6B are enlarged cross-sectional views of a pressure sensor mount in accordance with an embodiment of the present invention.
Figure 6B:
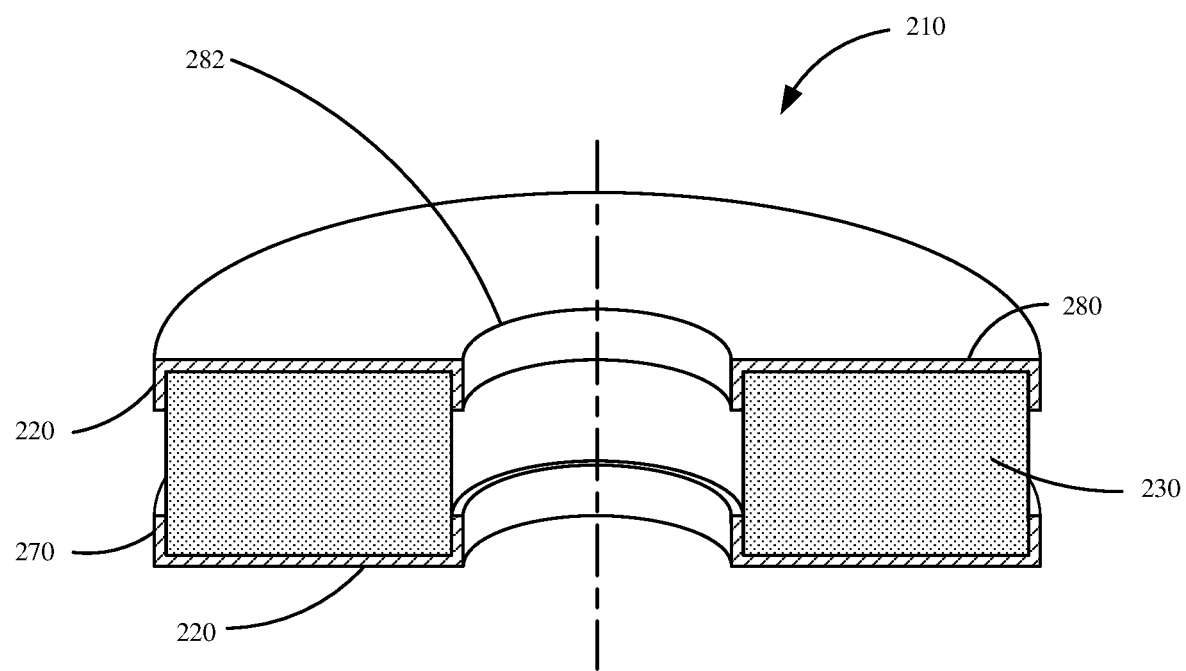

FIGS. 6A and 6B are close-up views of a pressure sensor mount in accordance with one embodiment of the present invention. Pressure sensor 200 illustrated in FIG. 6 is similar to that illustrated with respect to FIGS. 4 and 5, and similar components may be numbered similarly. Pressure sensor 200 may comprise, in one embodiment, a pressure sensor die 240 coupled to a pressure via 252. Pressure sensor die 240 may, in one embodiment, be mounted on a pedestal 210.

Pedestal 210 may be comprised of a plurality of materials, for example one or more metallized portions 220, and a ceramic portion 230. At least some embodiments described herein provide different methods and systems for creating a pedestal 210 that reduces the risk of cracking along interfaces 290. Ceramic layer 230 is disposed between two metallized layers 220 and a solder or braze is used to join a metal component, such as a pressure sensor to ceramic 230.

FIG. 6B illustrates a close-up view of a pressure sensor pedestal 210, which comprises a ceramic layer 230 with metallization layers 220 on either side. In one embodiment, metal layers 220 and ceramic layer 230 all have substantially the same radius 280. A bore 282 extends throughout the metal layers 220 and ceramic layer 230. Each metal layer 220 is, in one embodiment, deposited on ceramic layer 230 and later joined to a metal component using solder or braze. In one embodiment, the deposited metal extends over the entire joint area, which includes the planar areas shown in FIG. 6B. In one embodiment, metal layers 220 are substantially the same thickness.

Figure 7:
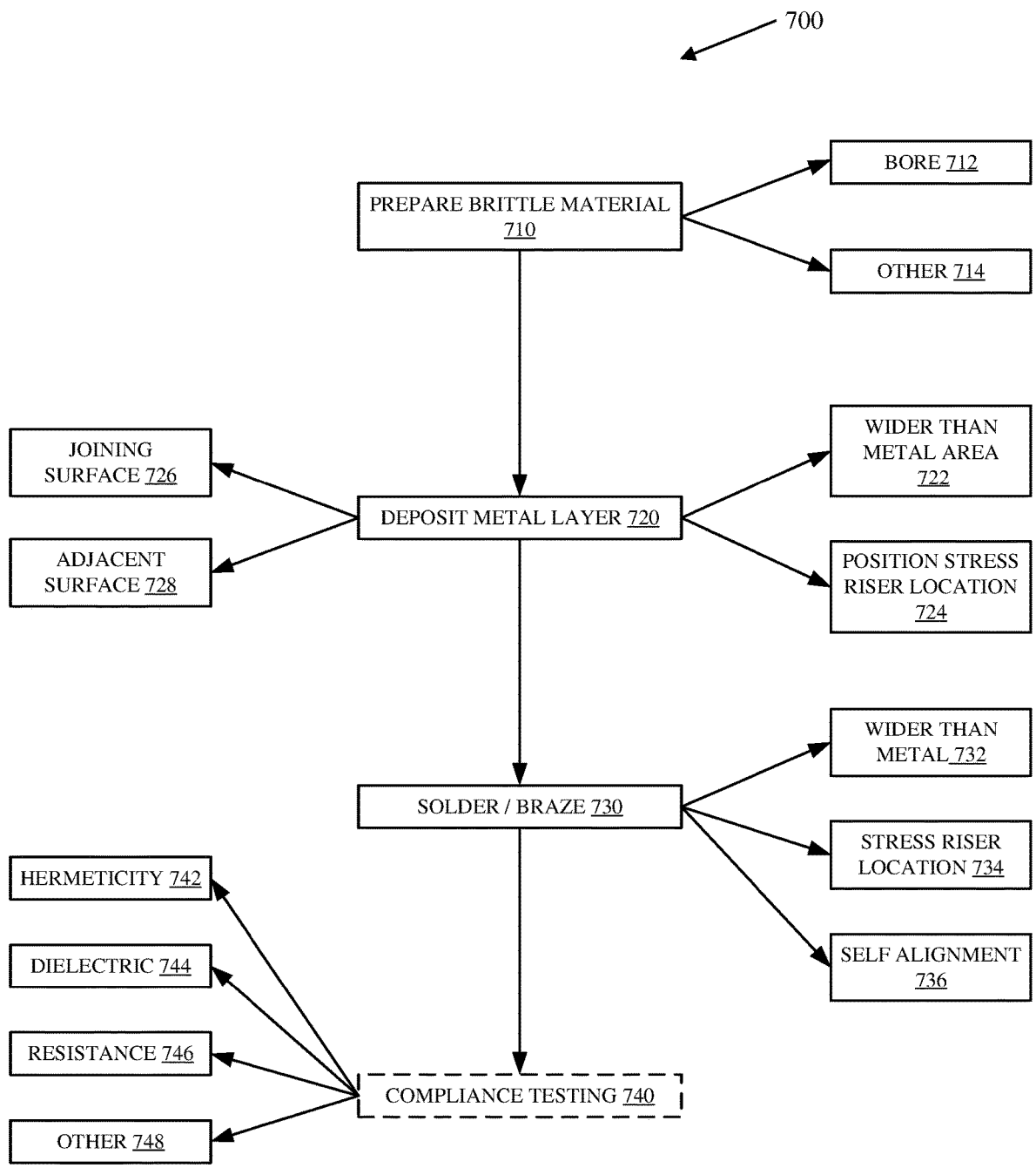
FIG. 7 is a flow diagram of a method of providing a pressure sensor mount in accordance with an embodiment of the present invention.

FIG. 7 is a flow diagram of a method of joining a brittle component to a metal component using a solder or braze joint in accordance with one embodiment of the present invention. Method 700 is described in the context of forming a pedestal for a pressure sensor with a ceramic layer between two metal layers, in one embodiment. However, it is to be understood that the methods and configurations described herein can be used for a variety of solder or brazing operations for joining a brittle material to another component.

In block 710, the brittle material is prepared. In one embodiment, for example in order to create a pedestal for a pressure transmitter, the brittle material has a bore disposed therethrough in order to properly join to a pressure sensor die and receive a pressure conveying tube, as indicated in block 712. Typically such bore will be molded with the ceramic component, but can be created in any suitable manner. The brittle material may also undergo other preparation steps, as indicated in block 714, for example cleaning, surfacing, etc.

In block 720, the brittle material undergoes a metal deposition process, where a layer of metal is deposited on a surface of the brittle material. In one embodiment, for example where the brittle material is to be joined to a metal component, the metal layer is deposited in an area that is wider than the area that will receive the metal component, as indicated in block 722. In one embodiment, the metal layer is deposited strategically in order to move a stress riser location out of an area that will receive a metal component, for example, as indicated in block 724. In one embodiment, moving a stress riser location comprises depositing the metal layer over an edge of the brittle material, such that the stress riser location will not be parallel to the joint area. In one embodiment, the metal deposition layer extends substantially along the joining surface, as indicated in block 726. In one embodiment, metal deposition layer extends past an edge of a joining surface, onto an adjacent surface, as indicated in block 728.

In block 730, a solder, or braze, operation is completed. The solder or braze operation, in one embodiment, comprises joining a metal component to the brittle material using an intervening layer of solder or braze material. The solder layer is wider than the area that will receive the metal component, as indicated in block 732. The solder layer may extend beyond an edge of the brittle component, in one embodiment. In one embodiment, the solder or braze layer is applied strategically such that a stress riser location is located outside of the area that will receive the metal component, for example as indicated in block 734. In one embodiment, the solder layer is applied such that, when the metal component comes into contact with the ceramic component, the components will self-align with respect to each other, as indicated in block 736. The self-alignment occurs as the metal and ceramic components align such that stress is reduced between the two components.

In block 740, optional compliance testing of the joined ceramic and metal component is conducted. Pedestals of pressure transmitters are known to fail during installation process because of cracks initiated between brittle and metal components during the joining process. Therefore, it is important that compliance testing occurs prior to installation, and sometimes after installation, of a pedestal within a pressure transmitter. The individual components should, therefore, be able to withstand compliance testing. Compliance testing is an optional test and can include any or all of the options listed in blocks 742-748, for example a hermeticity test, as indicated in block 742, and/or a dielectric test, as indicated in block 744 and/or an insulation resistance test, as indicated in block 746 and/or other testing, as indicated in block 748, such as applying a heat or pressure test to ensure that the pedestal can withstand a variety of operating environments.

Embodiments and methods described herein relate to a solder or braze joint including at least one surface of a brittle, electrically insulating material that is metallized to enable a solder or braze joint. The solder or brazed wetted metallization termination is, in one embodiment, located away the joining surface between the metal and ceramic layers. The metallized termination point is on a surface adjacent to the joining surface. In one embodiment, the metallization layer extends beyond the joining area, and past an edge feature of the electrically insulating layer, such that the metallization termination point is on a surface that is not parallel to the joining surface.

In one embodiment, the brittle material comprises ceramic aluminum oxide and the metal components comprise a nickel plated Kovar plate. In other embodiments, the brittle material is a conductor or a semiconductor material. The brazing material, in one embodiment, comprises a silver alloy.

Although the present invention has been described with reference to preferred embodiments, workers skilled in the art will recognize that changes may be made in form and detail without departing from the spirit and scope of the invention.

What is claimed is:

1. A pressure sensor comprising:
   a transmitter coupled to pressure measurement circuitry;
   a pressure sensor die configured to receive a process pressure and provide an output indicative of the process pressure to the process measurement circuitry;
   a pressure sensor body; and
   a pressure sensor pedestal, coupled to the pressure sensor die, the pressure sensor pedestal configured to provide insulation between the pressure sensor die and the pressure sensor body, the pressure sensor pedestal comprising:
      an insulating layer comprising a brittle material, the insulating layer being configured to isolate the pressure sensor body from the pressure sensor die;
      a metallization layer disposed on the insulating layer;
      a material joining layer coupling the metallization layer to the pressure sensor die; and wherein the coupled metallization layer and joining layer extend beyond the insulating layer and the pressure sensor die.

2. The pressure sensor of claim 1, wherein the insulating layer comprises a cylinder.

3. The pressure sensor of claim 1, wherein a bore hole extends through the insulating layer, and wherein the bore hole receives process pressure from a fluid.

4. The pressure sensor of claim 1, wherein the metallization layer and the joining material are applied such that the insulating layer and the pressure sensor die self-align in a reduced stress configuration.

5. The pressure sensor of claim 1, wherein the joining material comprises one of a solder and braze material.

6. The pressure sensor of claim 1, wherein the metallization layer extends along at least two surfaces of the insulating layer.

7. The pressure sensor of claim 1, wherein the metallization layer extends along a first surface of the insulating layer, past an edge of the insulating layer, and up a portion of a second surface of the insulating layer.

8. The pressure sensor of claim 7, wherein the second surface of the insulating layer is adjacent the first surface of the insulating layer.

9. The pressure sensor of claim 7, wherein the edge of the insulating layer includes a convex edge feature.

10. The pressure sensor of claim 1, wherein the pressure sensor body is coupled to process piping by a process coupling.

11. The pressure sensor of claim 1, wherein the transmitter is configured to measure a pressure applied by a process fluid.

12. The pressure sensor of claim 11, wherein the process fluid applies the pressure to an isolation diaphragm.

13. The pressure sensor of claim 12, wherein the isolation diaphragm is configured to deflect upon application of the pressure, and wherein upon deflection an isolation fluid is carried to the pressure sensor through a passageway coupled to the isolation diaphragm.

14. The pressure sensor of claim 1, wherein the transmitter is configured to provide an output over a process control loop to a remote location.

15. The pressure sensor of claim 14, wherein the process control loop includes a two wire process control loop.

16. The pressure sensor of claim 14, wherein the process control loop operates in accordance with an appropriate protocol.

17. A method of assembling a pressure sensor, the method comprising:
    coupling, electronically, a transmitter to pressure measurement circuitry;
    coupling, electronically, a pressure sensor die to the pressure measurement circuitry;
    coupling a pressure sensor pedestal to the pressure sensor die;
    housing pressure measurement circuitry, the pressure sensor die, and
        the pressure sensor pedestal within a pressure sensor body; and
    wherein, coupling the pressure sensor pedestal to the pressure sensor die comprises:
        depositing a metallization layer on a surface of an insulating layer, the insulating layer configured to isolate the pressure sensor die from the pressure sensor body;
        applying a layer of joining material between the metallization layer and the pressure sensor die and forming an interface between the layer of joining material and metallization layer; and
    wherein the interface extends beyond a surface of at least either the insulating layer or the pressure sensor die.

18. The method of claim 17, wherein the interface extends beyond the surface of the pressure sensor die.

19. The method of claim 18, wherein the interface extends beyond the surface of the insulating layer.

20. The method of claim 17, wherein the interface extends beyond both the surface of the insulating layer and the surface of the pressure sensor die.

* * * * *